United States Patent
Chien et al.

(10) Patent No.: US 9,603,287 B1
(45) Date of Patent: Mar. 21, 2017

(54) INTEGRATED POWER MODULE

(71) Applicant: INDUSTRIAL TECHNOLOGY RESEARCH INSTITUTE, Hsin-Chu (TW)

(72) Inventors: Shih-Hsiang Chien, Yilan County (TW); Chin-Hone Lin, Nantou County (TW); Ching-Jin Tyan, Hsinchu County (TW); Bo-Tseng Sung, Hsinchu (TW)

(73) Assignee: INDUSTRIAL TECHNOLOGY RESEARCH INSTITUTE, Hsin-Chu (TW)

( * ) Notice: Subject to any disclaimer, the term of this patent is extended or adjusted under 35 U.S.C. 154(b) by 0 days.

(21) Appl. No.: 14/969,596

(22) Filed: Dec. 15, 2015

(30) Foreign Application Priority Data

Oct. 30, 2015 (TW) .............................. 104135786 A

(51) Int. Cl.
*H05K 7/20* (2006.01)
*H05K 3/00* (2006.01)
(Continued)

(52) U.S. Cl.
CPC ....... *H05K 7/20409* (2013.01); *H05K 3/0061* (2013.01); *H05K 5/0013* (2013.01); *H05K 5/0247* (2013.01)

(58) Field of Classification Search
CPC ..... H01L 23/20; H01L 23/24; H01L 23/3735; H01L 23/5385; H05K 1/0306;
(Continued)

(56) References Cited

U.S. PATENT DOCUMENTS 5,291,065 A * 3/1994 Arai et al. .......... H01L 23/5385
257/691
5,446,318 A * 8/1995 Koike et al. ........ H01L 23/3735
257/707
(Continued)

FOREIGN PATENT DOCUMENTS

CN 103633077 A 3/2014
TW 201431268 A 8/2014
(Continued)

OTHER PUBLICATIONS

Intellectual Property Office, Ministry of Economic Affairs, R.O.C., "Notice of Allowance", Aug. 5, 2016, Taiwan.
(Continued)

*Primary Examiner* — Adrian S Wilson
(74) *Attorney, Agent, or Firm* — Locke Lord LLP; Tim Tingkang Xia, Esq.

(57) ABSTRACT

An integrated power module is provided, which may include a gate driver circuit, a plurality of first metal plates, a plurality of chips, a plurality of second metal plates, and an annular frame. The first metal plates may be parallel to each other/one another, and electrically coupled to the gate driver circuit; at least one of the first metal plates may include a plurality of chip slots. The chips may be disposed at the chip slots; each of the chips may be electrically coupled to one of the adjacent first metal plates. The second metal plates may be parallel to each other/one another, and electrically coupled to the gate driver circuit; each of the second metal plates may be disposed between any two adjacent first metal plates. The first metal plates, the second metal plates, the gate driver circuit, and the chips may be disposed inside the annular frame.

18 Claims, 12 Drawing Sheets

(51) Int. Cl.
*H05K 5/02* (2006.01)
*H05K 5/00* (2006.01)

(58) Field of Classification Search
CPC ............ H05K 3/0061; H05K 7/20409; H05K 5/0013; H05K 5/0247
See application file for complete search history.

(56) References Cited

U.S. PATENT DOCUMENTS

| | | | |
|---|---|---|---|
| 5,907,477 A * | 5/1999 | Tuttle et al. | H01L 23/24 174/260 |
| 5,926,372 A * | 7/1999 | Rinehart et al. | H01L 22/20 257/706 |
| 8,237,260 B2 | 8/2012 | Tschirbs | |
| 8,466,541 B2 | 6/2013 | Jones et al. | |
| 2004/0022029 A1 | 2/2004 | Nagatomo et al. | |
| 2004/0217465 A1 | 11/2004 | Stolze | |
| 2008/0230905 A1 | 9/2008 | Guth et al. | |
| 2010/0127371 A1 | 5/2010 | Tschirbs | |
| 2011/0057713 A1 | 3/2011 | Kawanami et al. | |

FOREIGN PATENT DOCUMENTS

| | | |
|---|---|---|
| TW | 1455286 B | 10/2014 |
| TW | M495551 U | 2/2015 |
| TW | 1478479 B | 3/2015 |

OTHER PUBLICATIONS

He, W. J. et al., Tackling reliability of power module, IEEE, 2015, 2931-2933.

Yamada, Y. et al., Study on thermal design due to downsizing of power module using coupled electrical-thermal-mechanical analysis, IEEE, 2012, 1-7.

Chun-Kai Liu et al., 600V, 450A IGBT power module for 50kw electrical vehicle, 4th IEEE International Symposium on Power Electronics for Distributed Generation Systems (PEDG), 2013, 1-5.

Diaoliang Chen et al., Analysis and Suppression of Inductive Interference in an Active Integrated Power Electronics Module, IEEE Transactions on Components and Packaging Technologies, 2009, vol. 32, Issue: 4.

Kwang-Soo Kim et al., Novel substrate technology for IPM (intelligent power module) applications: Structural, thermal and electrical characteristics, 14th International Conference on Electronic Materials and Packaging (EMAP), 2012, 1-3.

Tanimoto, S. et al., High Junction Temperature and Low Parasitic Inductance Power Module Technology for Compact Power Conversion Systems, IEEE Transactions on Electron Devices, 2015, vol. 62, Issue: 2.

Whitaker, B. et al., High-frequency AC-DC conversion with a silicon carbide power module to achieve high-efficiency and greatly improved power density, 4th IEEE International Symposium on Power Electronics for Distributed Generation Systems (PEDG), 2013, 1-5.

* cited by examiner

INTEGRATED POWER MODULE

CROSS REFERENCE TO RELATED APPLICATION

All related applications are incorporated by reference. The present application is based on, and claims priority from, Taiwan Application Serial Number 104135786, filed on Oct. 30, 2015, the disclosure of which is hereby incorporated by reference herein in its entirety.

TECHNICAL FIELD

The technical field relates to a power module, in particular to an integrated power module.

BACKGROUND

In general, the power circuit of a conventional power module and its gate driver circuit are separated; therefore, each of the power circuit and the gate driver circuit should have one packaging structure. Besides, the power circuit needs several signal buses to electrically coupled to the external gate driver circuit; therefore, the above structure will significantly increase the size of the conventional power module. For the above reasons, the conventional power module cannot be applied to light-weight vehicles or small-size machine tools, etc., which significantly limits the application range of the conventional power module.

Also, power modules are always operated in an environment with serious vibration; however, the conventional power module cannot effectively fix its components, so its chips and signal buses tend to drop off because of vibration; therefore, the failure rate of the conventional power module is very high, which significantly influences its performance.

Besides, for the purpose of achieving proper electrical-isolation and thermal-dissipation effects, the conventional power module should be processed by the thermal-dissipation paste and the electrical-isolation paste respectively; accordingly, its manufacturing process is very complicated, and needs more time and manpower, which will significantly increase its cost.

Many different power modules have been developed to solve the above problems, such as US patent publication No. 20110057713, U.S. Pat. No. 8,237,260, Taiwan patent publication No. 1478479; however, these power modules still have a lot of shortcomings to be overcome.

SUMMARY

An integrated power module is provided, which may include a gate driver circuit, a plurality of first metal plates, a plurality of chips, a plurality of second metal plates, and an annular frame. The first metal plates may be parallel to each other/one another, and electrically coupled to the gate driver circuit; at least one of the first metal plates may include a plurality of chip slots. The chips may be disposed at the chip slots; each of the chips may be electrically coupled to one of the adjacent first metal plates. The second metal plates may be parallel to each other/one another, and electrically coupled to the gate driver circuit; each of the second metal plates may be disposed between any two adjacent first metal plates. The first metal plates, the second metal plates, the gate driver circuit, and the chips may be disposed inside the annular frame.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure and wherein.

DETAILED DESCRIPTION

Figure 1:
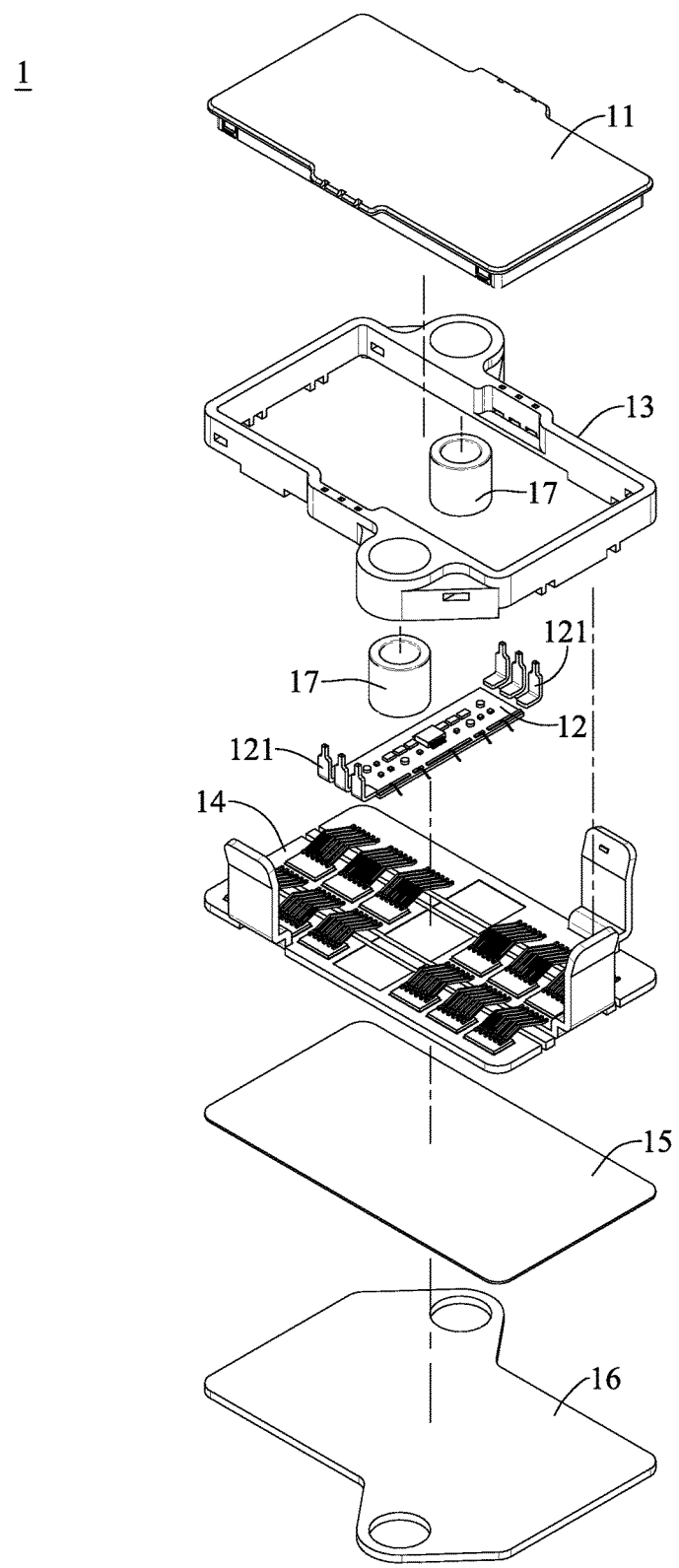
FIG. 1 is a first schematic view of a first embodiment of an integrated power module in accordance with the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
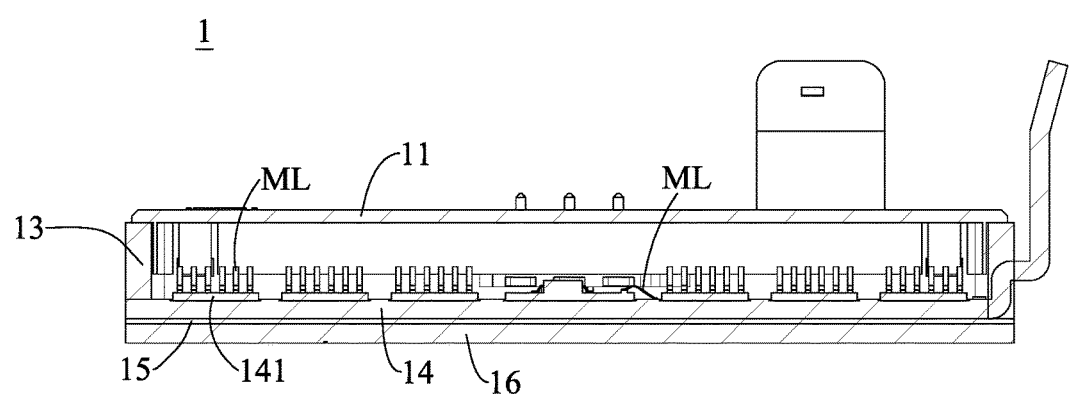
FIG. 2 is a second schematic view of a first embodiment of an integrated power module in accordance with the present disclosure.

Please refer to FIG. 1 and FIG. 2, which are a first schematic view and a second schematic view of a first embodiment of an integrated power module in accordance with the present disclosure. FIG. 1 illustrates an exploded view of the integrated power module of the embodiment. As shown in FIG. 1, the integrated power module may include a top cover 11, a gate driver circuit 12, an annual frame 13, a power circuit 14, an electrical-isolation thermal-dissipation pad 15, a thermal-dissipation base plate 16 and a plurality of connection elements 17.

FIG. 2 illustrates a cross-section view of the integrated power module of the embodiment. As shown in FIG. 2, the top cover 11 may be disposed at the top of the annual frame 13; the power circuit 14 may be disposed inside the annual frame 13; the thermal-dissipation base plate 16 may be disposed at the bottom of the annual frame 13; the electrical-isolation thermal-dissipation pad 15 may be disposed between the metal plates 142A, 142B, 142C, 143 and the thermal-dissipation base plate 16, and may contact the metal plates 142A, 142B, 142C, 143. More specifically, the power circuit 14 may include a plurality of chips 14; the gate driver circuit 12 may be disposed on the power circuit 14, and may be electrically coupled to the chips 141 via a plurality of metal trances ML.

Figure 3:
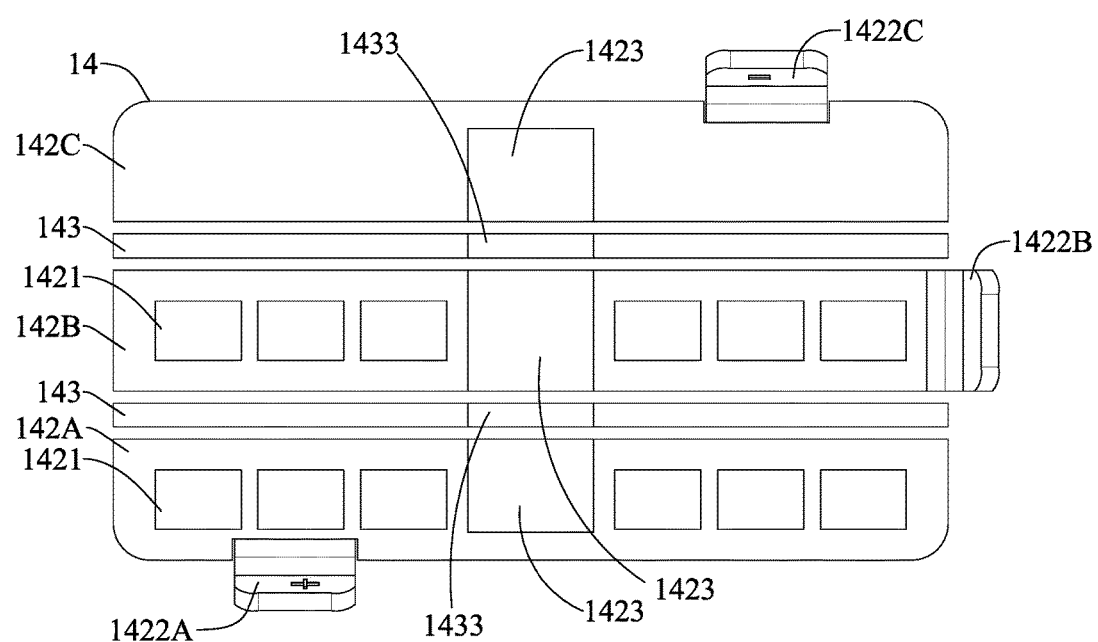
FIG. 3 is a third schematic view of a first embodiment of an integrated power module in accordance with the present disclosure.

Please refer to FIG. 3, which are a third schematic view of a first embodiment of an integrated power module in accordance with the present disclosure. FIG. 3 illustrates the detailed structure of the power circuit 14 of the embodiment.

As shown in FIG. 3, the power circuit 14 may include a plurality of first metal plates 142A, 142B, 142C and a plurality of second metal plates 143; the first metal plates 142A, 142B, 142C may be parallel to the second metal plates 143, and each of the second metal plates 143 may be disposed between any two adjacent first metal plates 142A, 142B, 142C.

The first metal plates 142A may include a lead 1422A; the first metal plate 142B may include a lead 1422B; the first metal plate 142C may include a lead 1422C; besides, each of the lead 1422A, 1422B, 1422C may include a first bending part and a second bending part, which just likes a ladder. Moreover, some of the first metal plates 142A, 142B, 142C may include a plurality of chip slots 1421, and the chips 141 of the power circuit 14 may be disposed at the chip slots 1421.

The center of each of the first metal plates 142A, 142B, 142C may include a recess 1423, and the center of each of the second metal plates 143 may include a recess 1433; the gate driver circuit 12 may be disposed at the recesses 1423, 1433.

Figure 4:
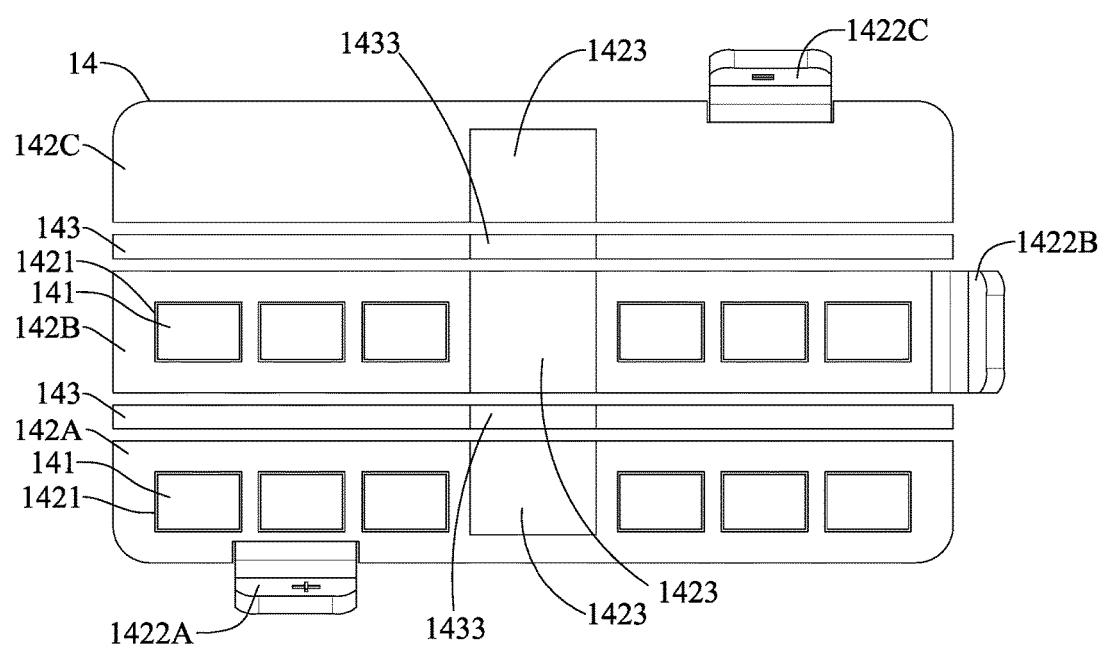
FIG. 4 is a fourth schematic view of a first embodiment of an integrated power module in accordance with the present disclosure.

Please refer to FIG. 4, which are a fourth schematic view of a first embodiment of an integrated power module in accordance with the present disclosure. FIG. 4 illustrates the detailed structure of the power circuit 14 of the embodiment. As shown in FIG. 4, among the first metal plates 142A, 142B, 142C, the first metal plates 142A, 142B at the middle and the left side of the power circuit 14 may include a plurality of chip slots 1421 for the chips of the power circuit 14 to be disposed at; besides, the size of each of the chip slots 1421 may be slightly larger than the size of each of the chips 141.

Figure 5:
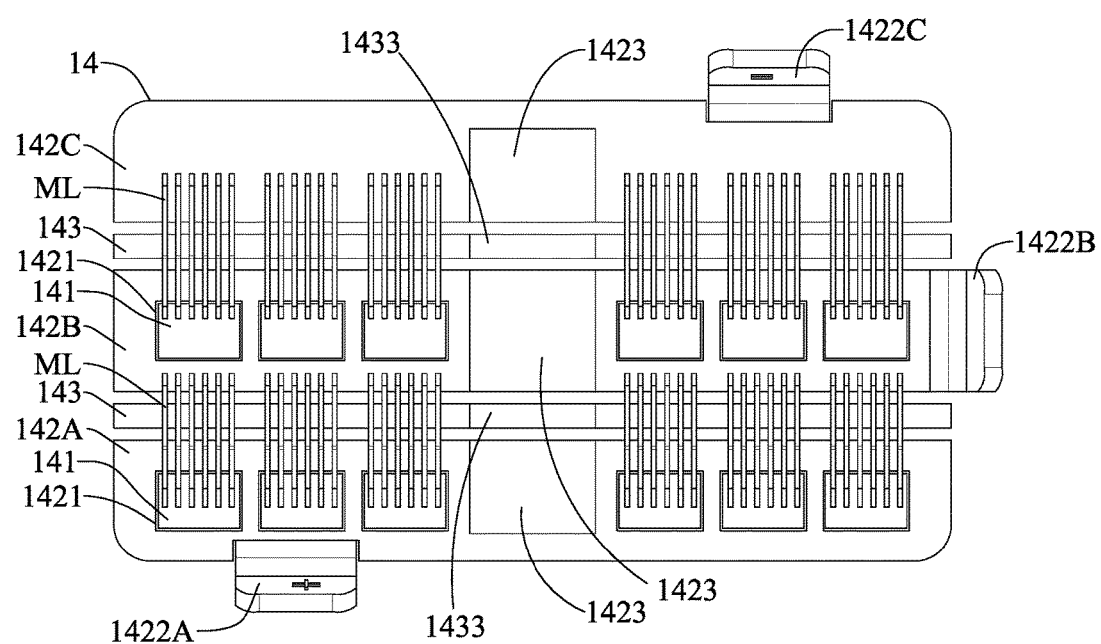
FIG. 5 is a fifth schematic view of a first embodiment of an integrated power module in accordance with the present disclosure.
Figure 6:
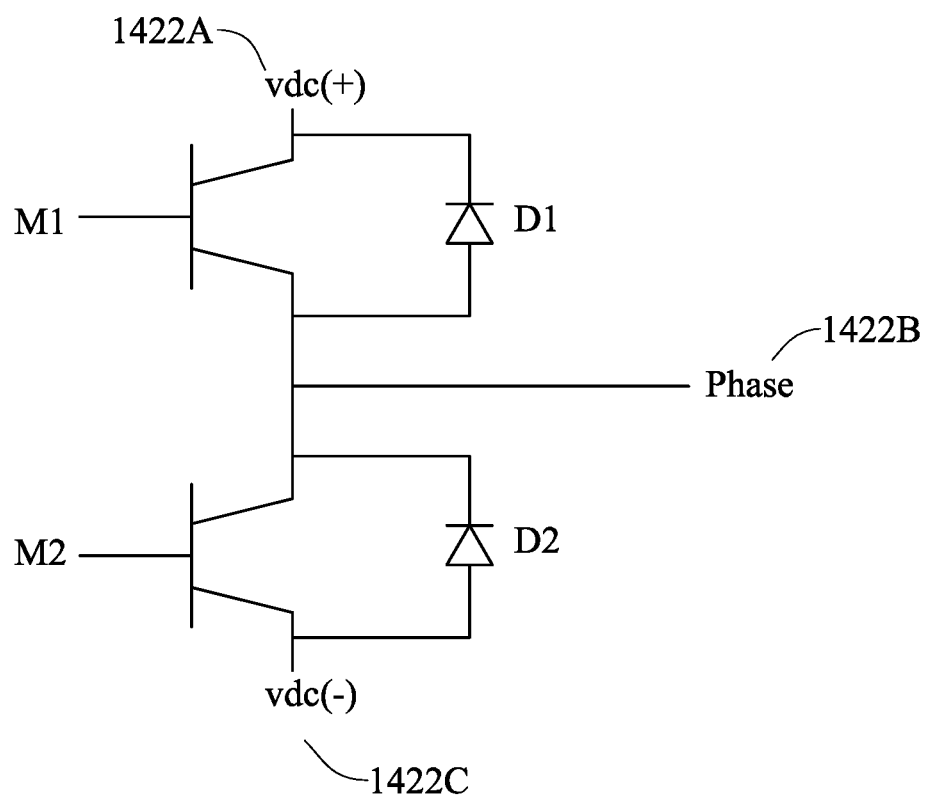
FIG. 6 is a sixth schematic view of a first embodiment of an integrated power module in accordance with the present disclosure.

Please refer to FIG. 5 and FIG. 6, which are a fifth schematic view and a sixth schematic view of a first embodiment of an integrated power module in accordance with the present disclosure. FIG. 5 illustrates the detailed structure of the power circuit 14 of the embodiment.

Each of the chips 141 may be electrically coupled to the adjacent first metal plate; as shown in FIG. 5, the chips 141 of the first metal plate 142A at the left side of the power circuit 14 may be electrically coupled to the first metal plate 142B at the meddle of the power circuit 14 via the metal traces ML. Similarly, the chips 141 of the first metal plate 142B at the middle of the power circuit 14 may be electrically coupled to the first metal plate 142C at the right side of the power circuit 14 via the metal traces ML. The chips 141 and metal traces ML may be fixed by a packaging means, such that the chips 141 and the metal traces ML will not drop off from the first metal plates 142A, 142B, 142C. The aforementioned packaging means can be any kinds of packaging technologies; all of which should be included in the scope of the claims of the present disclosure.

FIG. 6 illustrates the equivalent circuit of the power circuit 14 of the embodiment; in the equivalent circuit, the lead 1422A is corresponding to Vdc(+), the lead 1422B is corresponding to output phase, and the lead 1422C is corresponding to Vdc(−).

Figure 7:
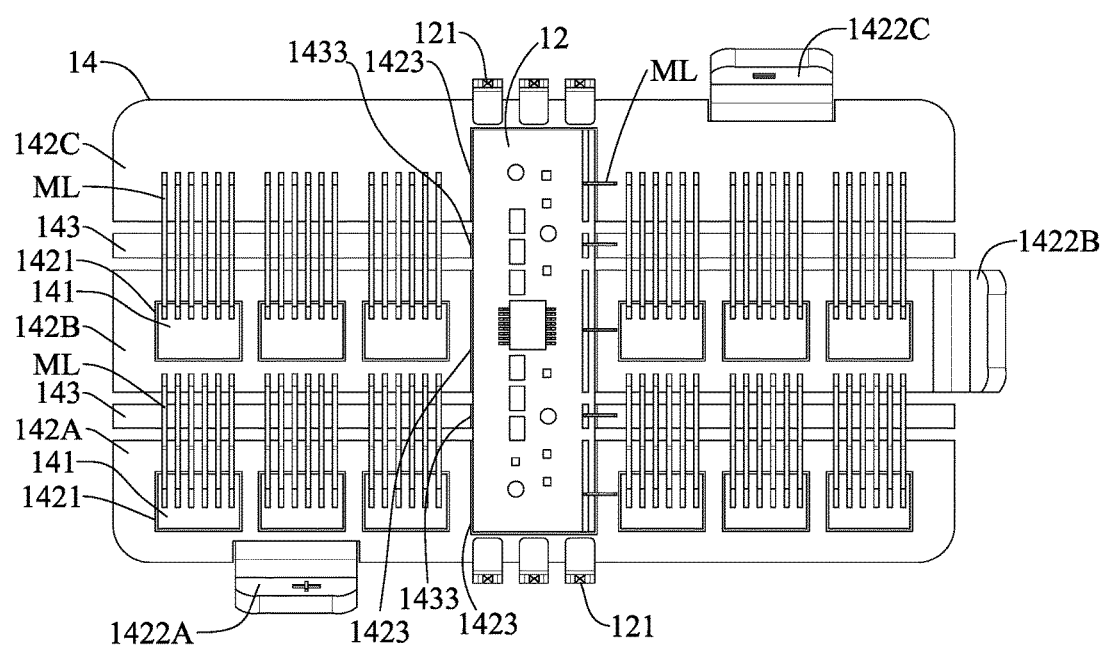
FIG. 7 is a seventh schematic view of a first embodiment of an integrated power module in accordance with the present disclosure.

Please refer to FIG. 7, which is a seventh schematic view of a first embodiment of an integrated power module in accordance with the present disclosure. FIG. 7 illustrates the detailed structures of the gate driver circuit 12 and the power circuit 14 of the embodiment.

As shown in FIG. 7, the gate driver circuit 12 may be disposed at the space formed by the recesses 1423, 1433 at the centers of the first metal plates 142A, 142B, 142C and the second metal plates 143. Besides, the gate driver circuit 12 may be electrically coupled to the first metal plates 142A, 142B, 142C and the second metal plates 143 via the metal traces ML. Further, the gate driver circuit 12 and the metal traces ML may be fixed by a packaging means, such that the gate driver circuit 12 and the metal traces ML will not drop off from the first metal plates 142A, 142B, 142C and the second metal plates 143. The aforementioned packaging means can be any kinds of packaging technologies; all of which should be included in the scope of the claims of the present disclosure.

Moreover, the gate driver circuit 12 may further include a plurality of signal pins 121; these signal pins 121 may be disposed at the two sides of the gate driver circuit 12, and each of the signal pins 121 may be L-shaped.

It is worthy to point out that the power circuit of a conventional power module is usually separated from its gate driver circuit, which will significantly increase its size; therefore, its application range is limited. On the contrary, according to one embodiment of the present disclosure, the integrated power module may integrate the power circuit and the gate driver circuit, so the integrated power module does not need to connect to an external gate driver circuit; therefore, the size of the integrated power module can be significantly reduce and the application rage of the integrated power module can be more comprehensive.

Also, the conventional power module cannot effectively fix its components, so the chips of its power circuit and the signal buses between the chips tend to drop off from its power circuit due to vibration, which will dramatically increase its failure rate and deteriorate its performance. On the contrary, according to one embodiment of the present disclosure, the chips of the power circuit and the gate driver circuit of the integrated power module may be disposed at the corresponding recesses of a plurality of metal plates, and the above components and the metal traces may be firmly fixed by a packaging means; therefore, the components and the metal traces of the integrated power module will not drop off due to vibration even if in an environment with serious vibration; accordingly, the failure rate of the integrated power module can be minimized and the performance of the integrated power module can be significantly improved.

Furthermore, according to one embodiment of the present disclosure, the integrated power module may have a compact structure design, which can dispose the chips of the power circuit and the gate driver circuit at a plurality of metal plates arranged in parallel, which can effectively take full advantage of the internal space of the integrated power module to further decrease its size.

Figure 8:
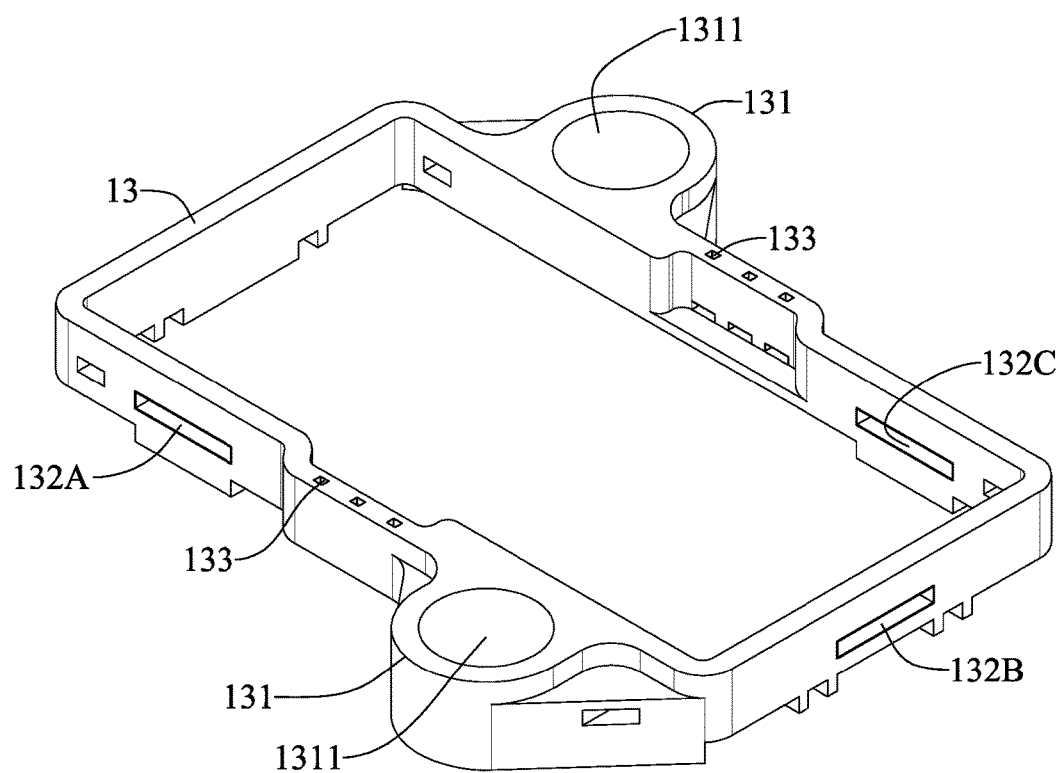
FIG. 8 is an eighth schematic view of a first embodiment of an integrated power module in accordance with the present disclosure.

Please refer to FIG. 8, which is an eighth schematic view of a first embodiment of an integrated power module in accordance with the present disclosure. FIG. 8 illustrates the detailed structures of the annual frame 13 of the embodiment.

As shown in FIG. 8, the annual frame 13 may include two first protrusion parts 131, and each of the first protrusion part 131 may include a first connection hole 1311.

The annual frame 13 may further include a plurality of lead holes 132A, 132B, 132C, which may be corresponding to the leads 1422A, 1422B, 1422C of the first metal plates 142A, 142B, 142C respectively; the leads 1422A, 1422B, 1422C may pass through the lead holes 132A, 132B, 132C respectively to protrude from the annual frame 13.

Besides, the annual frame 13 may further include a plurality of pin holes 13, which may be corresponding to the signal pins 121 of the gate driver circuit 12 respectively; the signal pins 121 may pass through the pin holes 133 respectively to protrude from the annual frame 13.

Figure 9:
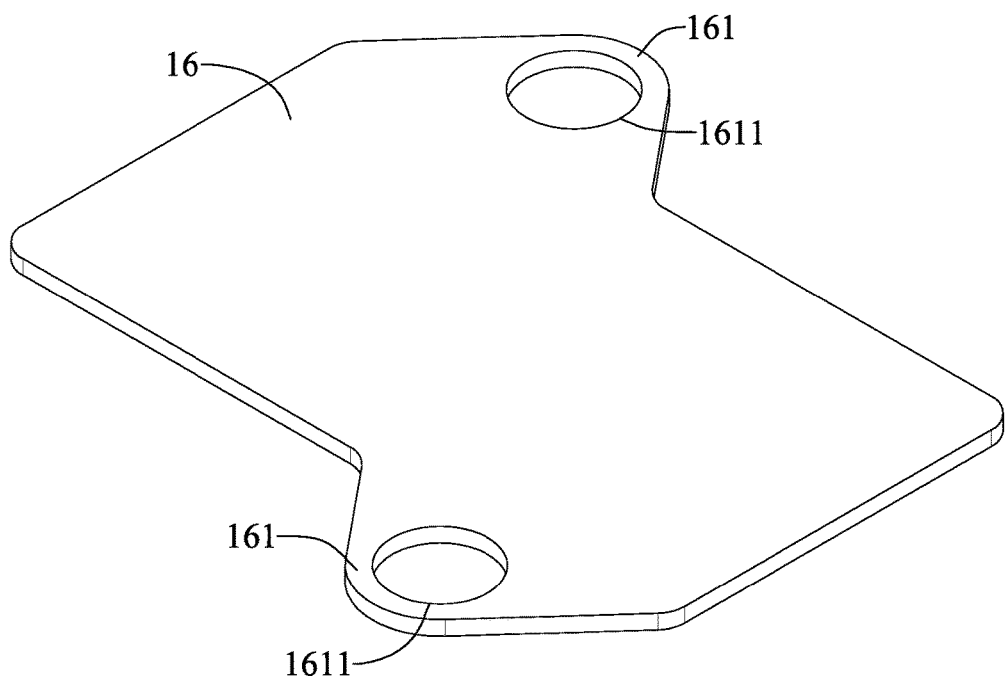
FIG. 9 is a ninth schematic view of a first embodiment of an integrated power module in accordance with the present disclosure.

Please refer to FIG. 9, which is a ninth schematic view of a first embodiment of an integrated power module in accordance with the present disclosure. FIG. 9 illustrates the detailed structures of the thermal-dissipation base plate 16 of the embodiment.

As shown in FIG. 9, the shape of the thermal-dissipation base plate 16 may be corresponding to the shape of the annual frame 13; the thermal-dissipation base plate 16 may include two second protrusion parts 161; each of the second protrusion parts 161 may include a second connection hole 1611, and the second connection holes 1611 may be corresponding to the first connection holes 1311 of the annual frame 13 respectively.

Figure 10:
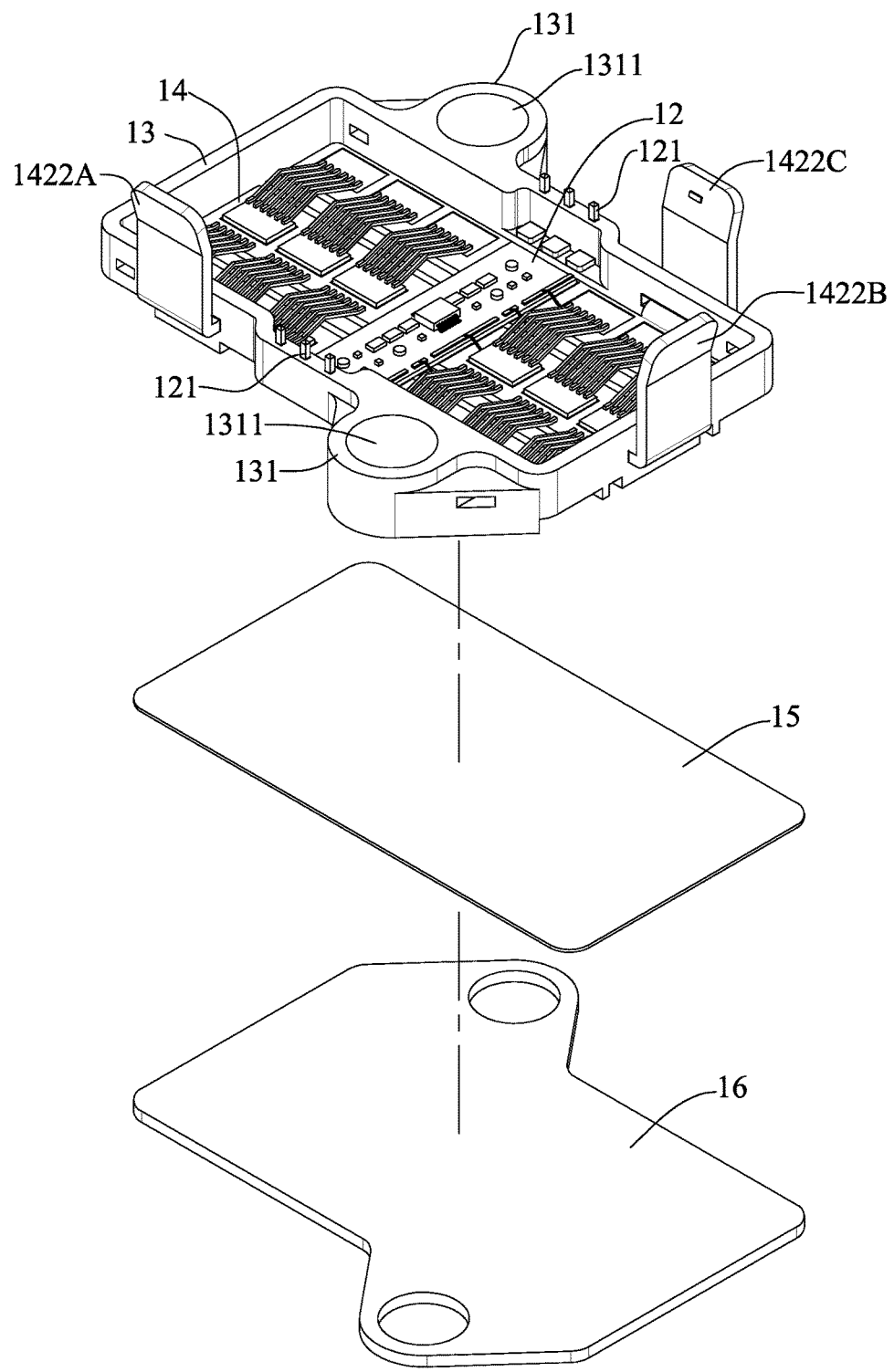
FIG. 10 is a tenth schematic view of a first embodiment of an integrated power module in accordance with the present disclosure.
Figure 11:
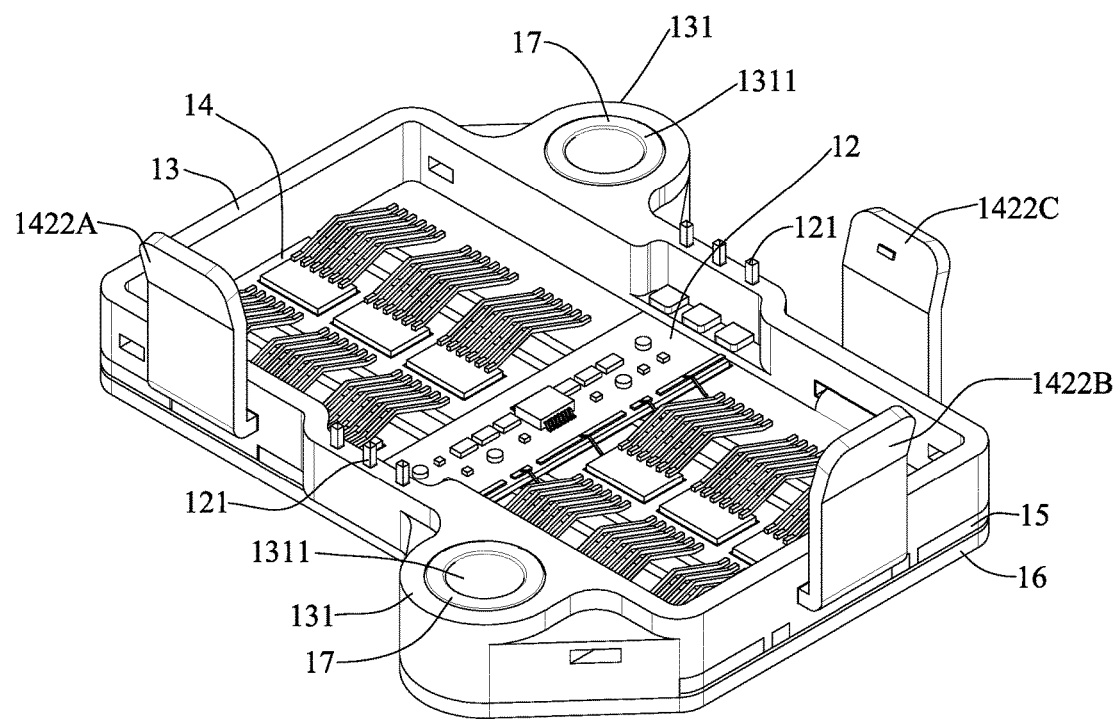
FIG. 11 is an eleventh schematic view of a first embodiment of an integrated power module in accordance with the present disclosure.

Please refer to FIG. 10 and FIG. 11, which is a tenth schematic view and an eleventh schematic view of a first embodiment of an integrated power module in accordance with the present disclosure. FIG. 10 and FIG. 11 illustrate the assembly drawings of the integrated power module 1 of the embodiment.

As shown in FIG. 10, the thermal-dissipation base plate 16 may be disposed at the bottom of the annual frame 13; the electrical-isolation thermal-dissipation pad 15 may be disposed between the metal plates 142A, 142B, 142C, 143 and the thermal-dissipation base plate 16. Besides, the electrical-isolation thermal-dissipation pad 15 may contact the metal plates 142A, 142B, 142C, 143 to dissipate the thermal energy of the power circuit 14 from the thermal-dissipation base plate 16 in order to improve the thermal-dissipation performance of the integrated power module 1. The leads 1422A, 1422B, 1422C of the power circuit 14 and the signal pins 121 of the gate driver circuit 12 may protrude from the annual frame 13.

As shown in FIG. 11, each of the first connection holes 1311 may be coupled to the corresponding second hole 1611 via the connection element 17 so as to fix the annual frame 13 and the thermal-dissipation base plate 16 together. The electrical-isolation thermal-dissipation pad 15 may be disposed between the metal plates 142A, 142B, 142C, 143 and the thermal-dissipation base plate 16, which can simultaneously achieve excellent electrical-isolation and thermal-dissipation effects; as a result, the integrated power module 1 does not need to be processed by the thermal-dissipation paste and the electrical-isolation paste respectively. Therefore, the manufacturing process of the integrated power module 1 can be simpler and the manufacturing cost of the integrated power module 1 can be significantly reduced.

It is worthy to point out that a conventional power module should be processed by the thermal-dissipation paste and the electrical-isolation paste respectively; accordingly, its manufacturing process is very complicated and its cost will also be significantly increased. On the contrary, according to one embodiment of the present disclosure, an electrical-isolation thermal-dissipation pad may be disposed between the metal plates and the thermal-dissipation base plate, which can simultaneously achieve excellent electrical-isolation and thermal-dissipation effects; thus, the integrated power module does not need to be processed by the thermal-dissipation paste and the electrical-isolation paste respectively; accordingly, the manufacturing process of the integrated power module can be simpler and the cost of the integrated power module can be significantly reduced. Besides, the electrical-isolation thermal-dissipation pad can effectively dissipate the thermal energy from the thermal-dissipation base plate, so the thermal-dissipation performance of the integrated power module can be effectively improved.

Figure 12:
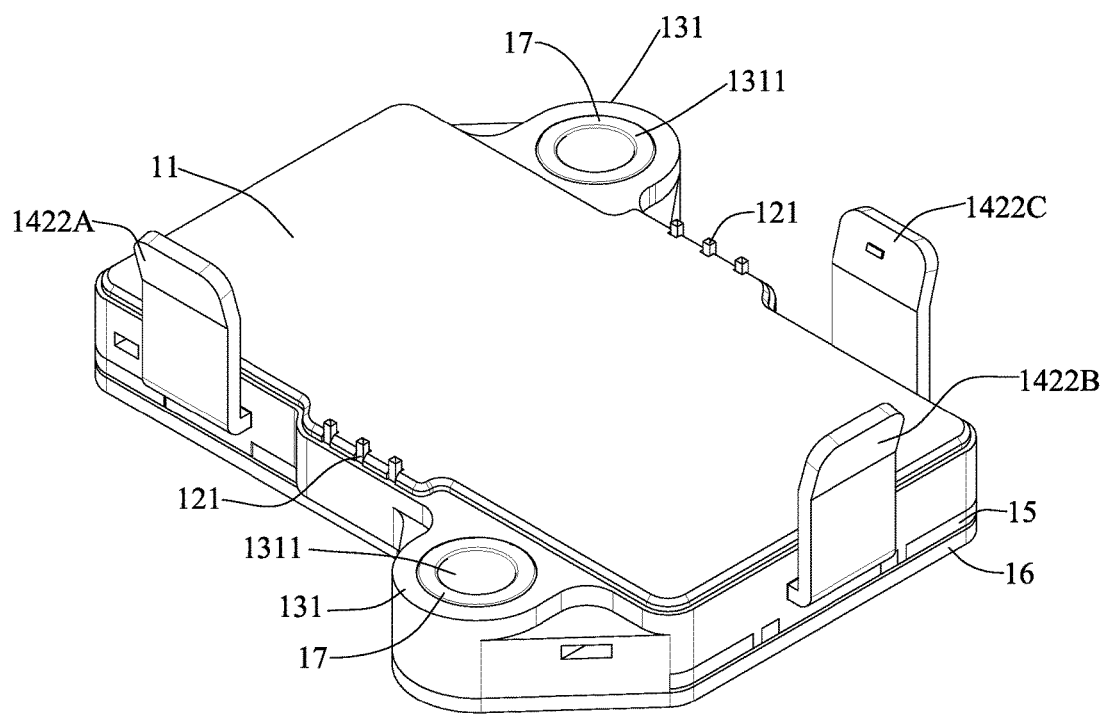
FIG. 12 is a twelfth schematic view of a first embodiment of an integrated power module in accordance with the present disclosure.

Please refer to FIG. 12, which is a twelfth schematic view of a first embodiment of an integrated power module in accordance with the present disclosure. FIG. 12 illustrate the assembly drawing of the integrated power module 1 of the embodiment.

The top cover 11 may be disposed at the top of the annual frame 13, such that the top cover 11, the annual frame 13 and the thermal-dissipation base plate 16 may form an enclosed structure. Besides, the top cover 11 may include a corresponding structure for the signal pins 121 of the gate drive circuit 12 to protrude from the top cover 11 and the annual frame 13.

In summation of the description above, the integrated power module according to the exemplary embodiments of the present disclosure may have the following advantages:

(1) According to one embodiment of the present disclosure, the integrated power module may integrate the power circuit and the gate driver circuit, so the integrated power module does not need to connect to an external gate driver circuit. Therefore, the size of the integrated power module can be significantly reduce and the application rage of the integrated power module can be more comprehensive.

(2) According to one embodiment of the present disclosure, the integrated power module may have a compact structure design, which can dispose the chips of the power circuit and the gate driver circuit at a plurality of metal plates arranged in parallel, which can effectively take full advantage of the internal space of the integrated power module to further decrease its size.

(3) According to one embodiment of the present disclosure, the chips of the power circuit and the gate driver circuit of the integrated power module are disposed at the corresponding recesses of a plurality of metal plates, and the above components and the metal traces are firmly fixed by a packaging means; therefore, the components and the metal traces of the integrated power module will not drop off due to vibration even if in an environment with serious vibration. Accordingly, the failure rate of the integrated power module can be minimized and the performance of the integrated power module can be significantly improved.

(4) According to one embodiment of the present disclosure, an electrical-isolation thermal-dissipation pad may be disposed between the metal plates and the thermal-dissipation base plate, which can simultaneously achieve excellent electrical-isolation and thermal-dissipation effects; thus, the integrated power module does not need to be processed by the thermal-dissipation paste and the electrical-isolation paste respectively. Accordingly, the manufacturing process of the integrated power module can be simpler, so the cost of the integrated power module can be significantly reduced.

(5) According to one embodiment of the present disclosure, an electrical-isolation thermal-dissipation pad may be disposed between the metal plates and the thermal-dissipation base plate, which can effectively dissipate the thermal energy from the thermal-dissipation base plate. Therefore, the thermal-dissipation performance of the integrated power module can be effectively improved.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An integrated power module, comprising:
   a gate driver circuit;
   a plurality of first metal plates, electrically coupled to the gate driver circuit; the first metal plates being parallel to each other/one another, and at least one of the first metal plates comprising a plurality of chip slots;
   a plurality of chips, disposed at the chip slots, and each of the chips electrically coupled to adjacent one of the first metal plates;
   a plurality of second metal plates, electrically coupled to the gate driver circuit; the second metal plates being parallel to each other/one another, and each of the second metal plates disposed between any adjacent two of the first metal plates; and
   an annual frame, accommodating the first metal plates, the second metal plates, the gate driver circuit, and the chips.

2. The integrated power module of claim 1, wherein the first metal plates, the second metal plates, the chips and the gate driver circuit are fixed by a packaging means.

3. The integrated power module of claim 1, wherein a size of each of the chip slots is larger than a size of each of the chips.

4. The integrated power module of claim 3, wherein the chips are fixed at the chip slots respectively by a packaging means.

5. The integrated power module of claim 1, wherein each of the chips is electrically coupled to adjacent one of the first metal plates via a plurality of metal traces.

6. The integrated power module of claim 1, wherein the first metal plates and the second metal plates are electrically coupled to the gate driver circuit via a plurality of metal traces.

7. The integrated power module of claim 1, wherein each of the first metal plates comprises a lead.

8. The integrated power module of claim 7, wherein each of the leads comprises a first bending part and a second bending part.

9. The integrated power module of claim 8, wherein the annual frame comprises a plurality of lead holes corresponding to the leads respectively, and each of the leads passes though corresponding one of the leads holes to protrude from the annual frame.

10. The integrated power module of claim 1, wherein the gate driver circuit is disposed on the first metal plates and the second metal plates, and the first metal plates and the second metal plates comprise a plurality of recesses corresponding to the gate driver circuit.

11. The integrated power module of claim 10, wherein the gate driver circuit further comprises a plurality of signal pins.

12. The integrated power module of claim 11, wherein the annual frame comprises a plurality of pin holes corresponding to the signal pins respectively, and each of the signal pins passes through corresponding one of the pin holes to protrude from the annual frame.

13. The integrated power module of claim 1, further comprising a top cover, disposed at a top of the annual frame.

14. The integrated power module of claim 13, further comprising a thermal-dissipation base plate, disposed at a bottom of the annual frame.

15. The integrated power module of claim 14, further comprising an electrical-isolation thermal-dissipation pad, disposed between the first metal plates, the second metal plates and the thermal-dissipation base plate, and contacting the first metal plates and the second metal plates.

16. The integrated power module of claim 15, wherein the annual frame comprises a first protrusion part, and the first protrusion part comprises a first connection hole.

17. The integrated power module of claim 16, wherein the thermal-dissipation base plate comprises a second protrusion part; the second protrusion part comprises a second connection hole and the second connection hole is corresponding to the first connection hole.

18. The integrated power module of claim 17, further comprising a connection element, passing through the first connection hole and the second connection hole to fix the annual frame and the thermal-dissipation base plate together.

* * * * *